(12) United States Patent
Yamada et al.

(10) Patent No.: US 7,772,536 B2
(45) Date of Patent: Aug. 10, 2010

(54) SOLID-STATE IMAGING DEVICE HAVING A PLURALITY OF SIGNAL CHARGE HOLDING UNIT WITH A WRITE TARGET SWITCHING UNIT AND A READ TARGET SWITCHING UNIT

(75) Inventors: Takayoshi Yamada, Osaka (JP);
Takumi Yamaguchi, Kyoto (JP);
Takahiko Murata, Osaka (JP);
Shigetaka Kasuga, Osaka (JP)

(73) Assignee: Panasonic Corporation, Osaka (JP)

( * ) Notice: Subject to any disclaimer, the term of this patent is extended or adjusted under 35 U.S.C. 154(b) by 765 days.

(21) Appl. No.: 11/785,625

(22) Filed: Apr. 19, 2007

(65) Prior Publication Data
US 2007/0285544 A1    Dec. 13, 2007

(30) Foreign Application Priority Data
Jun. 8, 2006    (JP)    ............................. 2006-159610

(51) Int. Cl.
*H01J 40/14*    (2006.01)
(52) U.S. Cl. ................................. 250/214 R; 250/208.1

(58) Field of Classification Search ............... 250/208.1, 250/214 R, 214 LS, 214 SW; 348/308–311, 348/364, 294; 257/290–296; 396/225, 429, 396/30
See application file for complete search history.

(56) References Cited

U.S. PATENT DOCUMENTS
5,659,359 A * 8/1997 Mochizuki et al. .......... 348/296

FOREIGN PATENT DOCUMENTS
JP    2000-165750    6/2000

\* cited by examiner

*Primary Examiner*—Que T Le
(74) *Attorney, Agent, or Firm*—McDermott Will & Emery LLP

(57) ABSTRACT

Provided is a solid-state imaging device that can perform a high-speed imaging, with appropriate number of pixels maintained. A plurality of pixels are arranged in a matrix in the solid-state imaging device. Each pixel includes a plurality of signal charge holding units that hold signal charges output from a photo diode. A write target switching unit selects the signal charge holding units so that signal charges output at different time points are written to the signal charge holding units, respectively. A read target switching unit switches between signal charge holding units from which to read a signal charge.

13 Claims, 16 Drawing Sheets

When writing

When reading

When reading (gain change)

FIG. 11
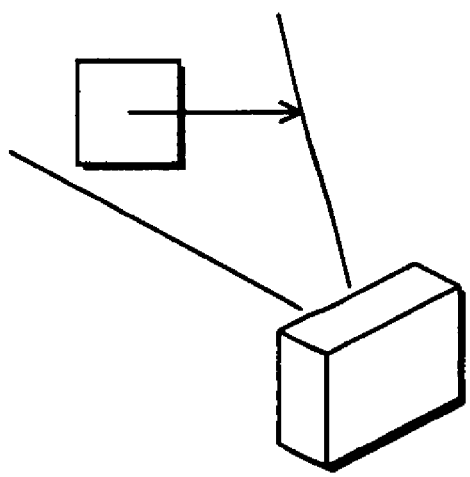
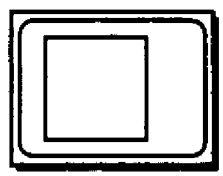
All-pixel simultaneous imaging
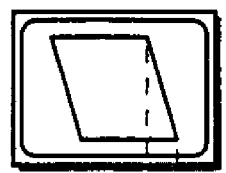
Shift caused by difference of 1ms
Sequential scanning type imaging

100

SOLID-STATE IMAGING DEVICE HAVING A PLURALITY OF SIGNAL CHARGE HOLDING UNIT WITH A WRITE TARGET SWITCHING UNIT AND A READ TARGET SWITCHING UNIT

BACKGROUND OF THE INVENTION (1) Field of the Invention

The present invention relates to a solid-state imaging device and a camera, and specifically to a technology of performing a high-speed imaging.

(2) Description of the Related Art

High-speed cameras are used in analyzing: (a) car crash test; (b) product drop test; (c) combustion state in internal combustion; (d) phenomena, such as chemical reactions, in the fields of physical chemistry; and so on.

Japanese Patent Application Publication No. 2000-165750 discloses a CCD type imaging device capable of performing a high-speed imaging, where a plurality of charge accumulation devices are arranged in the circumference of each photoelectric conversion device, and information is written into the charge accumulation devices when writing is performed.

However, the technology disclosed in the above-mentioned document is limited to a CCD type imaging device which is apt to consume an enormous amount of power, compared with a CMOS type imaging device.

SUMMARY OF THE INVENTION

The object of the present invention is therefore to provide a solid-state imaging device that is applicable to a CMOS type imaging device, and is capable of performing a high-speed imaging.

The above object is fulfilled by a solid-state imaging device comprising a plurality of pixels each of which includes: a photoelectric conversion device operable to perform a photoelectric conversion and output signal charges; a plurality of signal charge holding units operable to hold the signal charges output from the photoelectric conversion device; a write target switching unit operable to select, from among the signal charge holding units, one to which to write a signal charge that is output at a first time point, and switch from the selected one to another one among the signal charge holding units to which to write a signal charge that is output at a second time point after the first time point; and a read target switching unit operable to select, from among the signal charge holding units, one from which to read a signal charge.

The above-stated structure enables, for example, a CMOS type imaging device with reduced amount of power consumption to perform a high-speed imaging by writing signal charges, which are output at different time points, to different signal charge holding units.

Also, the above-stated structure makes it possible to extract an image in correspondence with a predetermined time point, by selectively reading a signal charge from a signal charge holding unit of each pixel that holds therein the signal charge output from the photoelectric conversion device at the predetermined timing, without reading signal charges from all the signal charge holding units of each pixel.

In the above-described solid-state imaging device, an order in which the read target switching unit selects the signal charge holding units may be equal to an order in which signal charges are written thereto.

With the above-stated structure, it is possible to simplify the circuit structure for reading.

In the above-described solid-state imaging device, the write target switching unit may continue to switch between the signal charge holding units at a regular time interval after the second time point until all the signal charge holding units have been selected.

With the above-stated structure, it is possible to perform an imaging with a high frame rate, by setting the regular time interval to be short.

The above-described solid-state imaging device may further comprise an imaging operation unit operable to cause all pixels to start performing an imaging operation simultaneously.

The above-stated structure produces an effect of an electronic shutter, for example. Also, the above-stated structure enables all pixels to start imaging at the same time. That is to say, it is possible to perform an all-pixel simultaneous exposure to achieve an imaging in which there is no difference between the times when different portions of the image are imaged.

In the above-described solid-state imaging device, each pixel may further include: a pre-writing amplifier device operable to amplify a signal output from the photoelectric conversion device before the signal is written to one of the signal charge holding units; a post-reading amplifier device operable to amplify the signal read from the signal charge holding unit; and an output device operable to output the signal, which was amplified by the post-reading amplifier device, to outside the pixel.

With the above-stated structure, it is possible to obtain signals having a high signal-to-noise ratio.

In the above-described solid-state imaging device, each pixel may further include an amplifier circuit that is shared by the pre-writing amplifier device and the post-reading amplifier device, and use of the amplifier circuit is switched between the pre-writing amplifier device and the post-reading amplifier device, for writing and reading, respectively.

With the above-stated structure, it is possible to reduce the area occupied by the amplifier circuits.

In the above-described solid-state imaging device, the signal charge holding units may be nonvolatile storage devices.

With the above-stated structure, it is possible to achieve a safe imaging device that keeps imaging information therein even if a power-off occurs suddenly, by using, for example, ferroelectric capacitors as the nonvolatile storage devices.

In the above-described solid-state imaging device, the signal charge holding units may be gate capacitance type capacitors.

With the above-stated structure, it is possible to reduce the area by using, for example, MOS type capacitors using the gate capacitance of the transistor, as the nonvolatile storage devices, and applying a common potential to diffusion areas of a plurality of capacitors.

In the above-described solid-state imaging device, each of the signal charge holding units may be a capacitor formed between wiring layer metals.

With the above-stated structure, it is possible to form high-accuracy capacitors with relative ease by using, for example, capacitors formed between wiring layers, in which metal layers as the wiring are used as electrodes, as the nonvolatile storage devices.

In the above-described solid-state imaging device, the signal charge holding units may be capacitors having metal electrodes, such as trench type capacitors.

With the above-stated structure, it is possible to use a memory process that is used for DRAM (Dynamic Random Access Memory) or the like. This makes it possible to form highly-integrated, large-capacity signal charge holding units at relatively low cost.

In the above-described solid-state imaging device, the signal charge holding units may be capacitor arrays formed on a sub substrate that is different from a main substrate, and the main substrate and the sub substrate are connected to each other by an external contact terminal.

The above-stated structure may be formed as follows, for example. First, vias passing through a substrate are formed respectively in correspondence with pixels of the solid-state imaging device. Then, contact points are formed on a back surface of another substrate at positions corresponding to the vias. And the two substrates are bonded with each other. This method makes it possible to form the main and sub substrates indifferent, most suitable processes respectively. Also, with this method, the pixels can be made smaller since there is no need to form a capacitor array in the pixel. Integration of the capacitor array becomes easier by using a dedicated process, making it possible to provide a large-capacity storage unit.

The above-described solid-state imaging device may further comprise: a storage device that is located outside the plurality of pixels, and stores therein a dark signal output from the photoelectric conversion device, when a signal is read from one of the signal charge holding units to outside a pixel; and a noise removing circuit operable to remove a variation in the pixels by calculating a difference between the dark signal stored in the storage device and a signal charge held by the one of the signal charge holding units.

With the above-stated structure, it is possible to obtain high-quality information by setting a noise removing circuit for each column so that the noise removing circuit can decrease the variation of the devices when reading information from the storage device of each pixel.

The above object is also fulfilled by a digital camera comprising the solid-state imaging device defined above.

With the above-stated structure, it is possible to provide a small digital camera that can perform imaging at a high speed, with appropriate number of pixels maintained.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings:

FIG. 11 shows an all-pixel simultaneous imaging operation.

DESCRIPTION OF THE PREFERRED EMBODIMENT

The following describes a preferred embodiment of the present invention with reference to the attached drawings.

Embodiment 1

Figure 1:
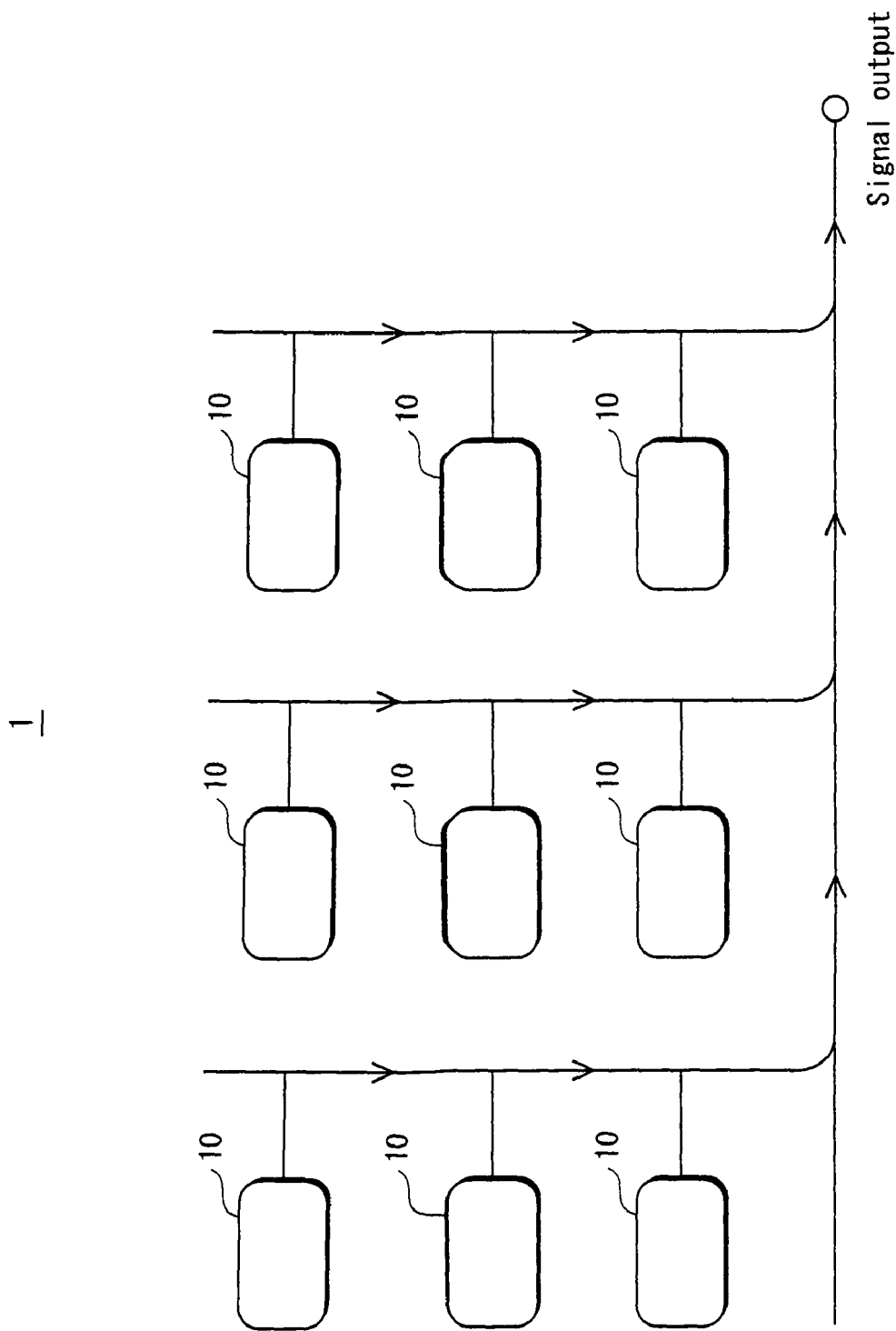
FIG. 1 shows an outlined structure of a solid-state imaging device 1.

FIG. 1 shows an outlined structure of a solid-state imaging device 1.

The solid-state imaging device 1 includes a plurality of pixel units 10 that are arranged in a matrix.

Figure 2:
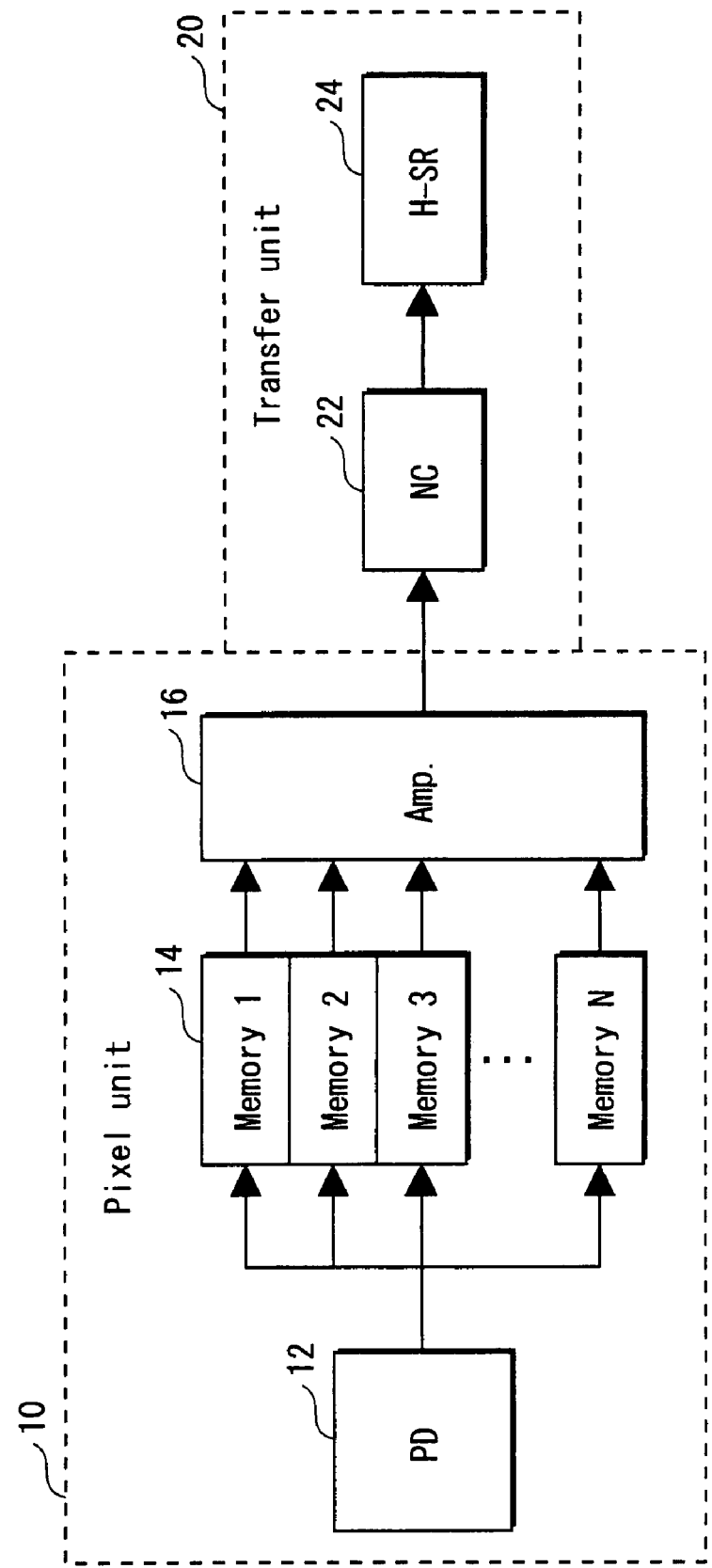
FIG. 2 is a functional block diagram showing a structure of the solid-state imaging device 1 in Embodiment 1.

FIG. 2 is a functional block diagram showing a structure of the solid-state imaging device 1 in Embodiment 1. FIG. 2 shows only unit pixels in the pixel units arranged in a matrix, for convenience of explanation.

The solid-state imaging device 1 includes the pixel unit 10 and a transfer unit 20.

The pixel unit 10 includes a photodiode (PD) 12 that is a photoelectric conversion device, a memory group 14, and an amplifier (Amp) 16.

The memory group 14 includes an N pieces of memories being storage devices. Each memory stores a signal charge output from the photoelectric conversion device, as an amount of analog.

The memory group 14 writes signals selectively to the N pieces of memories, and reads signals selectively from the N pieces of memories. This makes it possible to extract a given image without wasting the power consumption.

A specific example of the circuit structure will be described in detail later with reference to FIG. 3 and onwards.

The amplifier (Amp) 16 amplifies the signals that have been selectively read from the memories constituting the memory group 14.

The transfer unit 20 includes a noise canceling (NC) unit 22 and a horizontal shift register (H-SR) 24.

The noise canceling unit 22 removes noise components from the signals transferred from the amplifier 16 of the pixel unit 10.

EXAMPLE 1 OF CIRCUIT STRUCTURE

Figure 3:
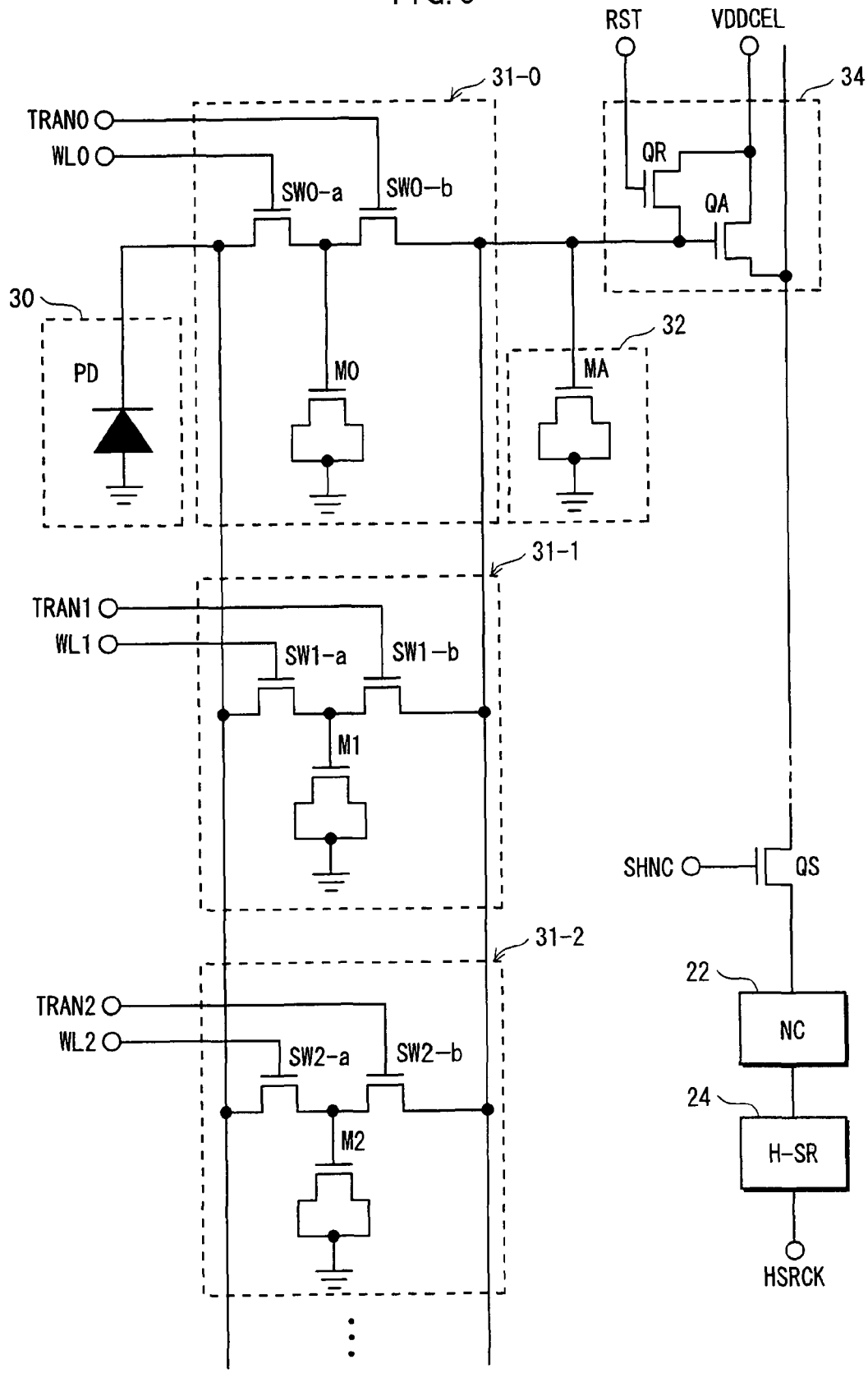
FIG. 3 shows an example of the circuit structure for achieving the functions shown in FIG. 2.

FIG. 3 shows an example of the circuit structure for achieving the functions shown in FIG. 2.

The circuit structure shown in FIG. 3 includes a light receiving unit 30, selective storage units 31-0, 31-1, and 31-2, a storage unit 32, an amplifying unit 34, the noise canceling (NC) unit 22, and the horizontal shift register (H-SR) 24.

The light receiving unit 30 includes a photodiode (PD) that is a photoelectric conversion device.

The first selective storage unit 31-0 includes switches SW0-a and SW0-b, and a gate capacitance type capacitor M0 that is a memory. The switches SW0-a and SW0-b are controlled to perform switching by control signals sent from a word line WL0 and a transistor line TRAN0, respectively.

The second and third selective storage units 31-1 and 31-2 have the same structure as the first selective storage unit 31-0. It should be noted that there are N pieces of selective storage units and that out of the N pieces, only three selective storage units are shown in the drawing. The value "N" as the number of selective storage units is, for example, in a range of 8 to 32.

The storage unit 32, having a capacitor MA, temporarily stores the signal charge read out from the selective storage unit 31.

The amplifying unit 34, having a reset transistor QR and an amplify reset transistor QA, resets the signal charge stored in the storage unit 32, and amplifies the signal charge. This enables highly accurate signals to be output.

With the circuit structure shown in FIG. 3, a signal charge obtained by a photodiode (PD) in accordance with a control signal sent from the word line WL0 is written sequentially to the N pieces of capacitors (M0 to M(n−1)) provided in a pixel.

For example, when an imaging is performed at a high-speed rate of 1000 frames per second, a signal that represents image information is written to the $M^{th}$ capacitors in all the pixels, in parallel. With this structure, a high-speed writing operation is realized.

When reading, it is possible to read given capacitors selectively among the capacitors M0 to M(n−1), by performing a signal control via the transistor line TRAN0.

In the case of the circuit structure shown in FIG. 3, one capacitor and two transistor switches are required per storage device. However, a reading operation and a writing operation can be performed simultaneously since the routes for writing and reading are separated from each other. Accordingly, a reading operation can be performed while a writing to another storage device is performed, for example.

According to the solid-state imaging device of the present invention, all pixels can perform imaging at the same time. The information obtained by the imaging is stored in the storage devices in the pixels, and the stored information can be extracted sequentially.

EXAMPLE 2 OF CIRCUIT STRUCTURE

Figure 4:
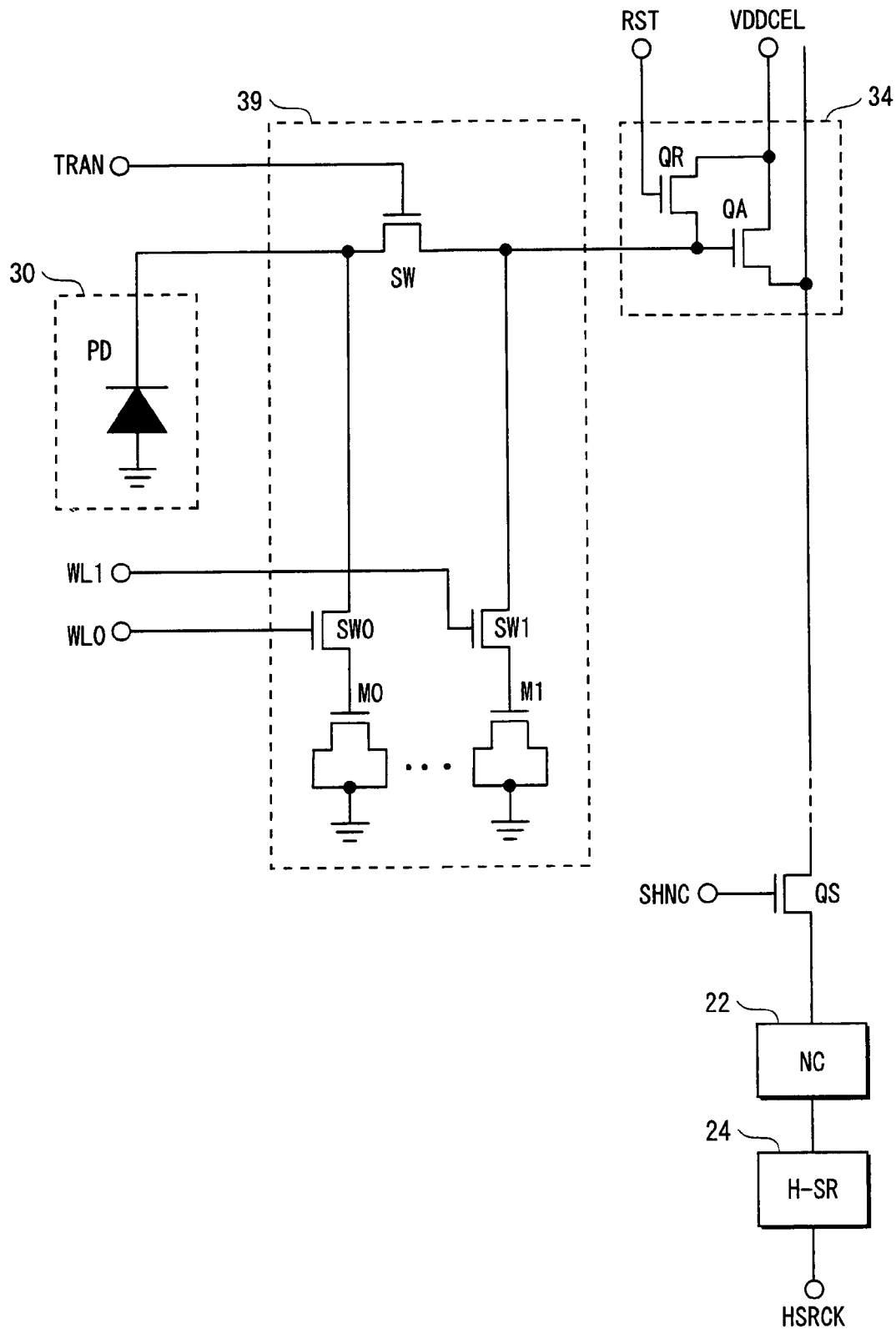
FIG. 4 shows another example of the circuit structure for achieving the functions shown in FIG. 2.

FIG. 4 shows another example of the circuit structure for achieving the functions shown in FIG. 2.

FIG. 4 includes common constituent elements with FIG. 2. The common constituent elements are assigned with the same reference signs and description thereof is omitted (This also applies to the subsequent drawings).

The circuit structure of FIG. 4 includes the light receiving unit 30, a selective storage unit 40, and the amplifying unit 34.

In the case of the circuit structure shown in FIG. 4, one capacitor and one transistor switch are required per storage device. The structure suits for a large storage capacity since the storage devices have the simple structure.

<Signal Amplifier>

The embedded signal amplifier may be a source follower type, an inverter type or the like. Due to the structure of the photoelectric conversion device, nMOS transistors are easier to form in the circumference of each photoelectric conversion device than pMOS transistors. Accordingly, it is possible to form the storage device selection switches, amplifiers and the like using only nMOS transistors so as to reduce the occupying space since it can omit, for example, the well separation for the pMOS transistors. Conversely, if there is no problem in increasing the area, the pMOS area may be formed to realize CMOS because it provides advantages such as eliminating the need for the boosting power supply. Also, the amplifiers may be achieved by CMOS inverters because it realizes high accuracy and low power consumption relatively easily.

Embodiment 2

The present embodiment is aimed to achieve writing and reading operations with a reduced amount of signal deterioration by providing amplifying circuits that are respectively dedicated to writing and reading to/from a memory being a storage device.

Figure 5:
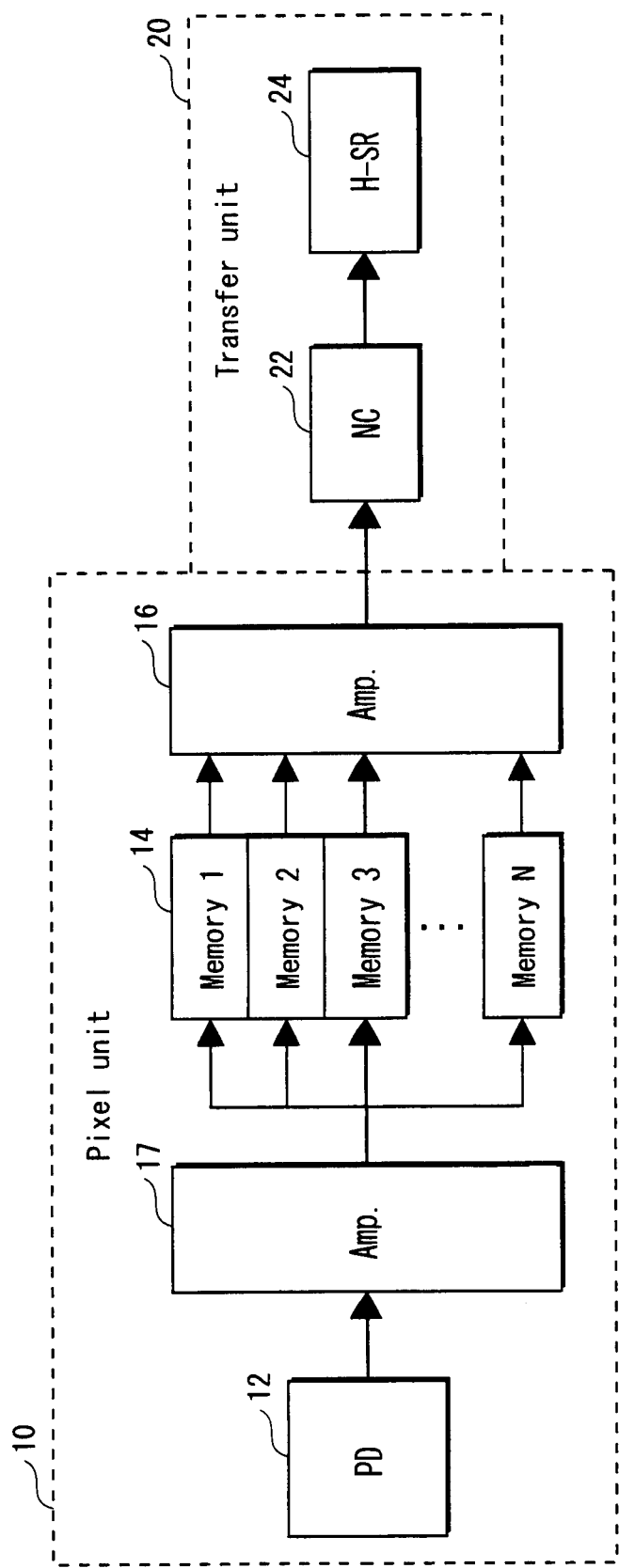
FIG. 5 is a functional block diagram showing a structure of the solid-state imaging device 1 in Embodiment 2.

FIG. 5 is a functional block diagram showing a structure of the solid-state imaging device 1 in Embodiment 2.

An amplifier (Amp) 17 amplifies the electric charges obtained by the photodiode (PD) 12, on the upstream side of the memory group 14. The amplifier (Amp) 16 amplifies the electric charges that have been read from the memory group.

Figure 6:
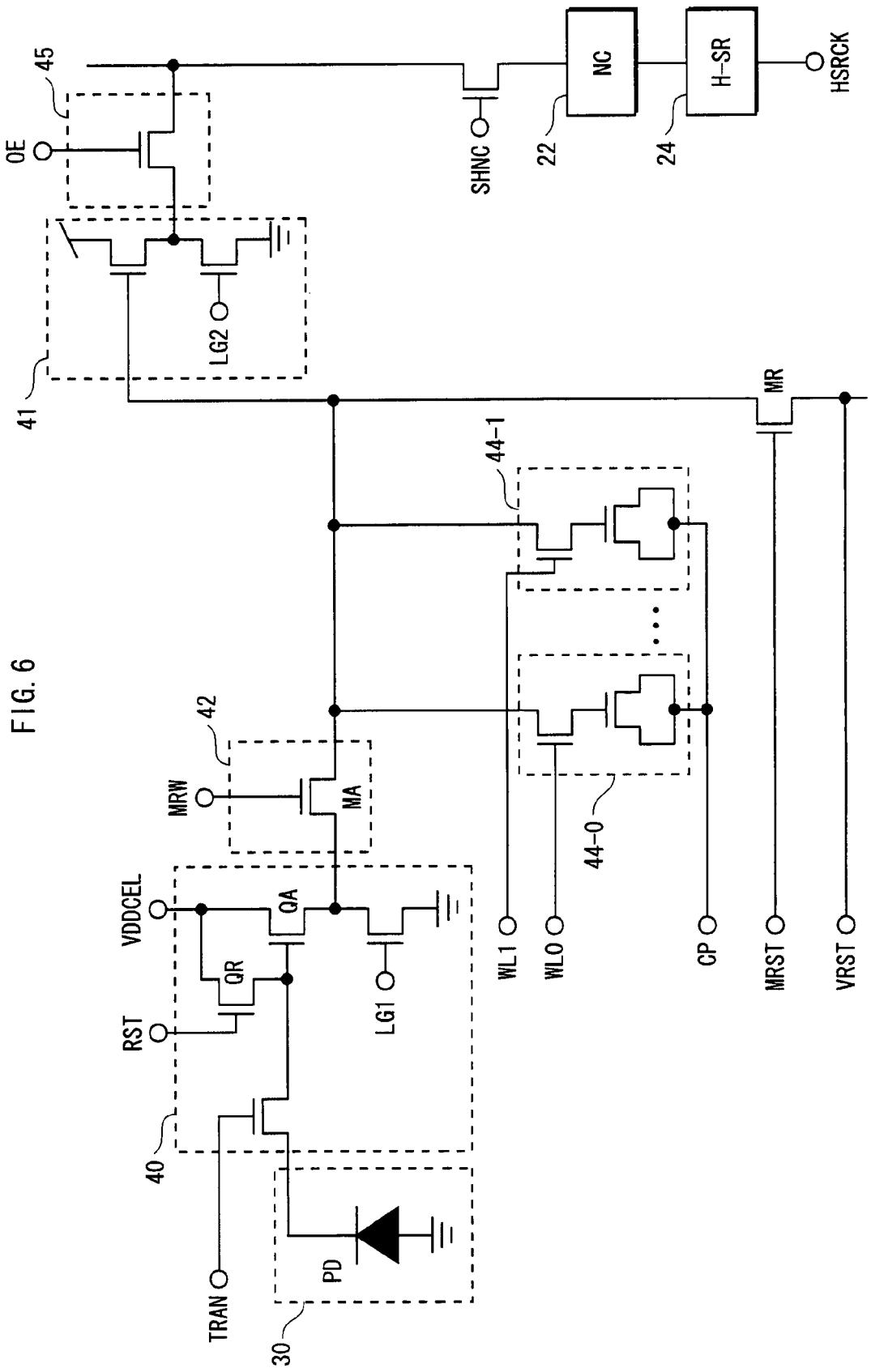
FIG. 6 shows an example of the circuit structure for achieving the functions shown in FIG. 5.

FIG. 6 shows an example of the circuit structure for achieving the functions shown in FIG. 5.

The circuit shown in FIG. 6 includes the light receiving unit 30, an amplifying unit 40 for amplifying a signal before the signal is written to the storage device, an amplifying unit 41 for amplifying a signal read out from the storage device, an output selective storage unit 45, a storage unit 42, and selective storage units 44-0 and 44-1.

The above-described circuit structure achieves writing and reading operations with a reduced amount of signal deterioration by providing amplifying circuits that are respectively dedicated to writing and reading to/from a storage device.

Embodiment 3

The present embodiment is aimed to reduce the area occupied by the amplifying units by sharing an amplifying unit when writing and reading.

Figure 7:
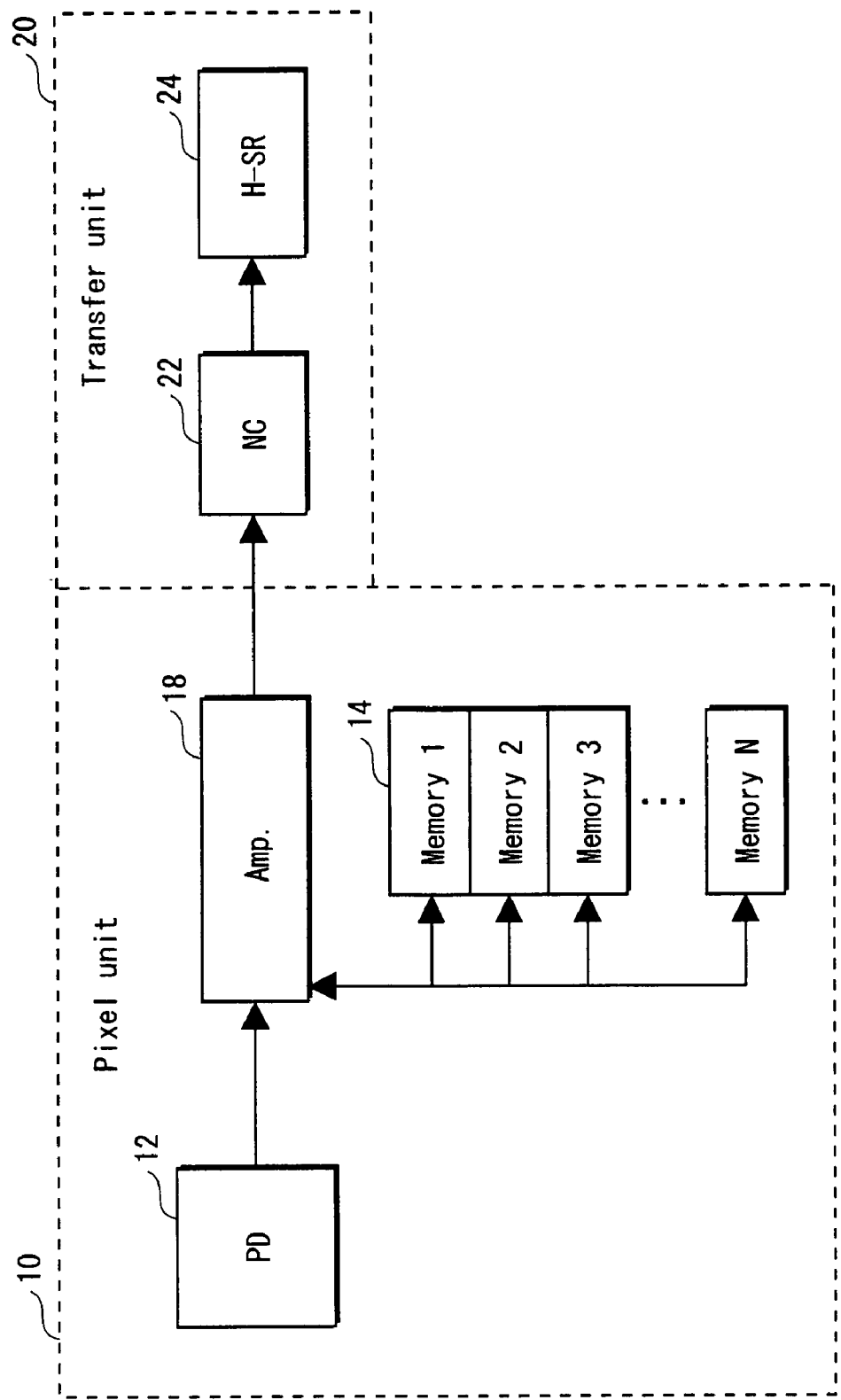
FIG. 7 is a functional block diagram showing a structure of the solid-state imaging device 1 in Embodiment 3.

FIG. 7 is a functional block diagram showing a structure of the solid-state imaging device 1 in Embodiment 3.

The pixel unit 10 includes the photodiode (PD) 12, the memory group 14, and an amplifier (Amp) 18.

The amplifier (Amp) 18 amplifies signals when writing and reading to/from a storage device.

Since, in general, writing and reading are not performed at the same time, the area occupied by the amplifying units can be reduced by sharing an amplifying unit when writing and reading.

EXAMPLE 1 OF CIRCUIT STRUCTURE

Figure 8:
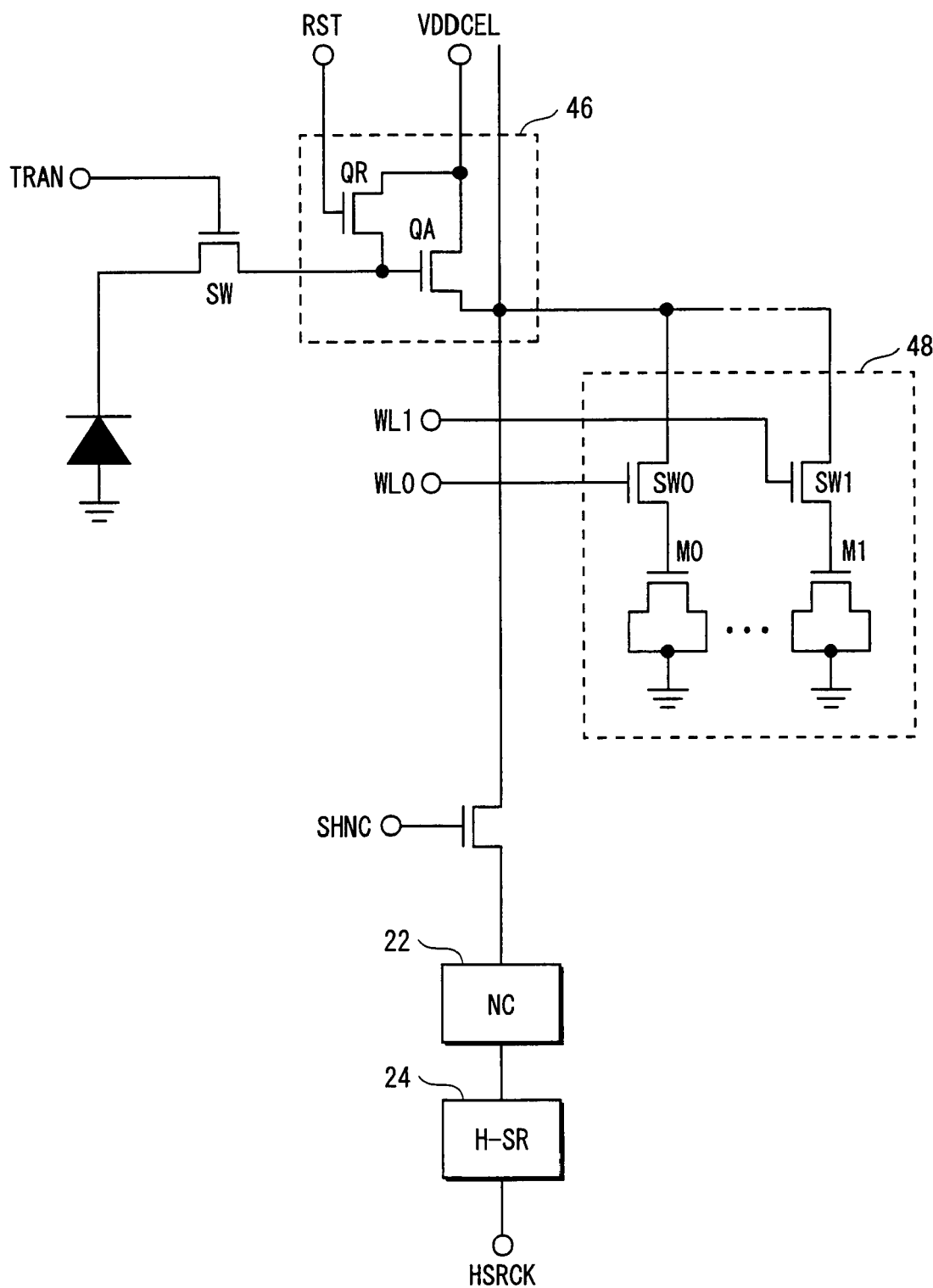
FIG. 8 shows an example of the circuit structure for achieving the functions shown in FIG. 7.

FIG. 8 shows an example of the circuit structure for achieving the functions shown in FIG. 7.

An amplifying unit 46 amplifies signals when writing and reading to/from a selective storage unit being a memory.

Here, an outline of sharing an amplifier will be described with reference to FIGS. 9A to 9C.

Figure 9A:
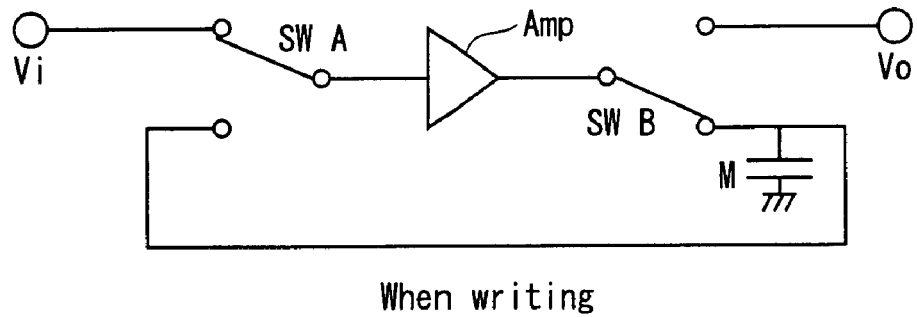
FIGS. 9A to 9C show an outline of sharing an amplifier.
Figure 9B:
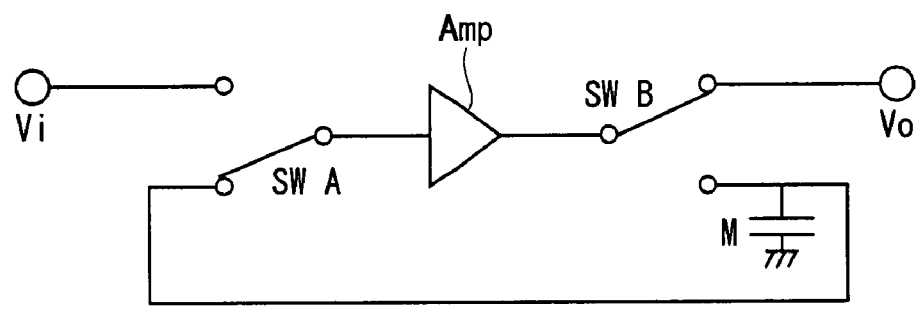

As shown in FIGS. 9A and 9B, by operating the switches SWA and SWB, it is possible to share an amplifier (Amp) when writing and reading.

Figure 9C:
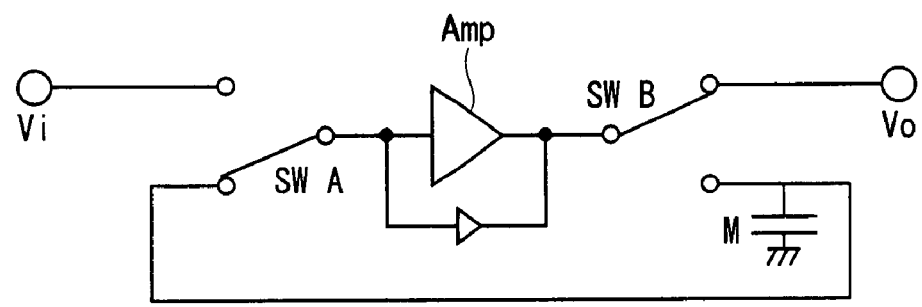

FIG. 9C shows an example of changing the gain of the amplifier (Amp).

In the case of the structure shown in FIG. 8, one capacitor and one transistor switch are required per storage device. With this structure in which a signal from the photoelectric conversion device is amplified using the amplifier before the signal is stored in a storage device, the anti-noise characteristic is improved. Also, a signal is amplified using the amplifier before the signal is output from a pixel. This enables a signal output with a high S/N ratio to be obtained with more ease. Since, writing and reading to/from a storage device are not performed at the same time, the area occupied by the amplifying units can be reduced by sharing an amplifying unit when writing and reading.

EXAMPLE 2 OF CIRCUIT STRUCTURE

Figure 10:
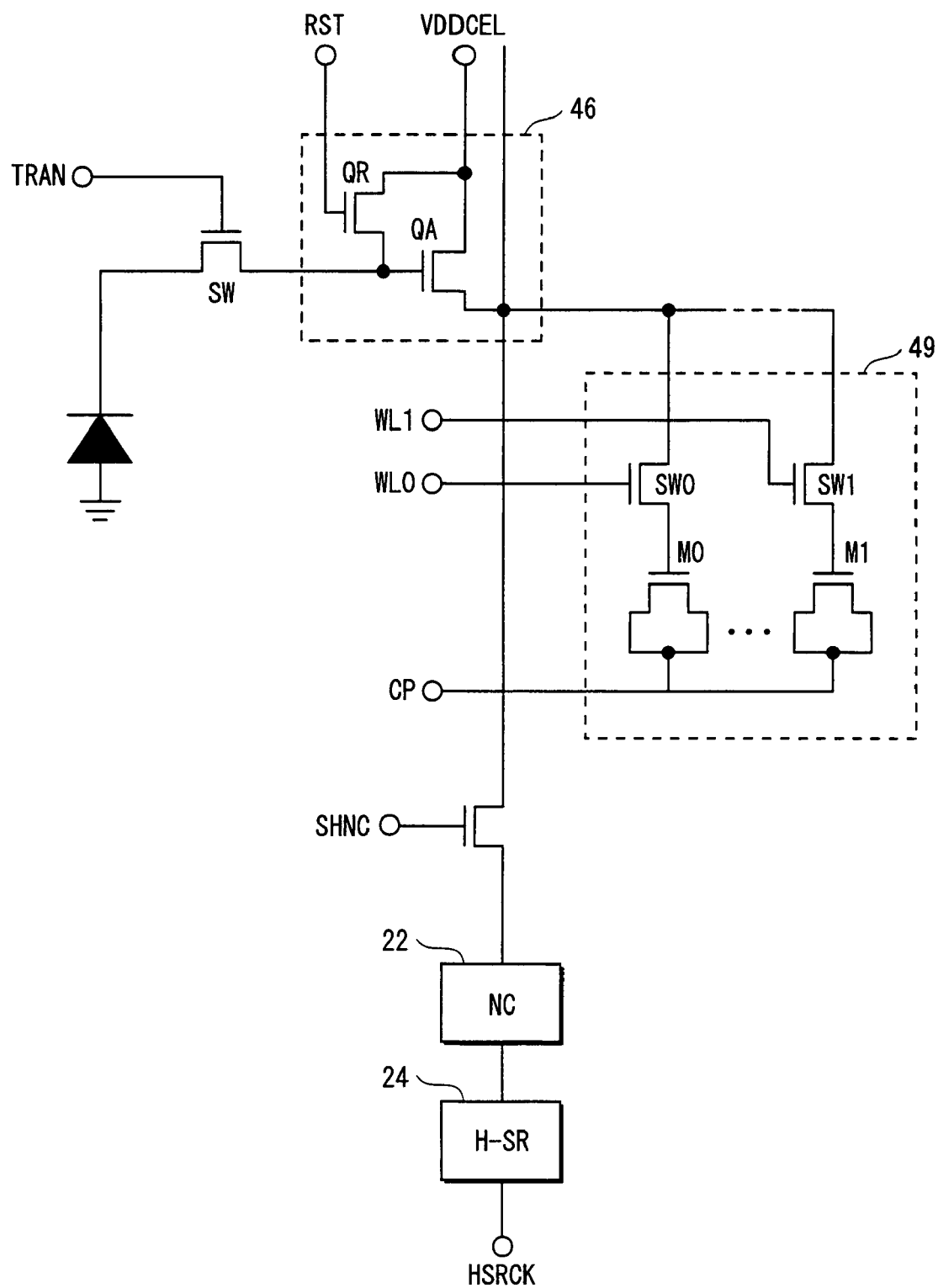
FIG. 10 shows another example of the circuit structure for achieving the functions shown in FIG. 7.

FIG. 10 shows another example of the circuit structure for achieving the functions shown in FIG. 7.

FIG. 10 shows substantially the same circuit structure as FIG. 8, but is different therefrom in that it includes a CP control line for driving the electrode of the capacitor. With this structure, it is possible to read a read signal with a high voltage by driving the CP when reading.

<Others>

The following describes modifications and supplementary notes of Embodiments 1-3.

(1) Amplifiers

In FIGS. 6, 8 and 10, source follower type amplifiers are shown. However, inverter type amplifiers may be used. Also, the amplifiers may be assigned to a plurality of levels of operations to increase the amplifying ratio.

To reduce the variation in the characteristics of the amplifiers in pixels, it is preferable to perform outputting based on the difference between (i) the dark signal that is output when the pixel is dark and (ii) the signal that is output when the image is input. However, the process requires a certain amount of time, and a very large scale of circuit is required to perform the process for all the pixels at the same time. For these reasons, in the stage of writing into the storage device, the present invention stores the output signal from the photoelectric conversion device as it is, or stores it after amplifying it by the amplifier. And in the reading stage, the circuit provided in each column calculates the difference from the dark signal output when each pixel is dark. This structure makes it possible to reduce the variation in the characteristics for each pixel, and to achieve a high-quality image with reduced fixed pattern noise.

(2) All-Pixel Simultaneous Imaging Operation

FIG. 11 shows an all-pixel simultaneous imaging operation.

It is possible to obtain an image without a distortion, by imaging all the pixels simultaneously.

When reading is performed by a conventional sequential scan method, such as the CMOS, the image is distorted. For example, when an imaging device, which scans a screen from top to bottom, is used to image an object that is moving from right to left, the object appears to be distorted diagonally, due to a slight difference between the times at which the upper portion and the lower portion of the image are respectively imaged. The distortion becomes more prominent as the object moves at a higher speed in the screen.

In contrast, in the case of the all-pixel simultaneous imaging operation, when, for example, an object moving at a high speed towards the right as shown in FIG. 11 is imaged, operations of transferring signals to the storage devices in the pixels can be performed simultaneously. Basically, there is no difference between the times when different portions of the image are imaged. This makes it possible to obtain an image without distortion.

(3) Imaging System

Figure 12:
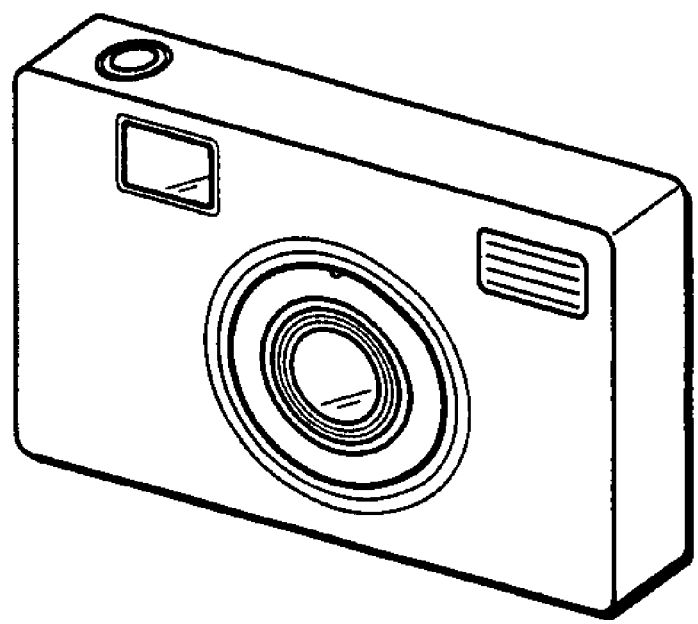
FIG. 12 is a schematic diagram showing a digital camera 100 that includes the solid-state imaging device 1 of Embodiment 1.

FIG. 12 is a schematic diagram showing a digital camera 100 that includes the solid-state imaging device 1 of Embodiment 1. It should be noted here that the solid-state imaging device 6 of the present embodiment is also applicable to a video camera. The application will realize a video camera that can image at a high speed.

Figure 13:
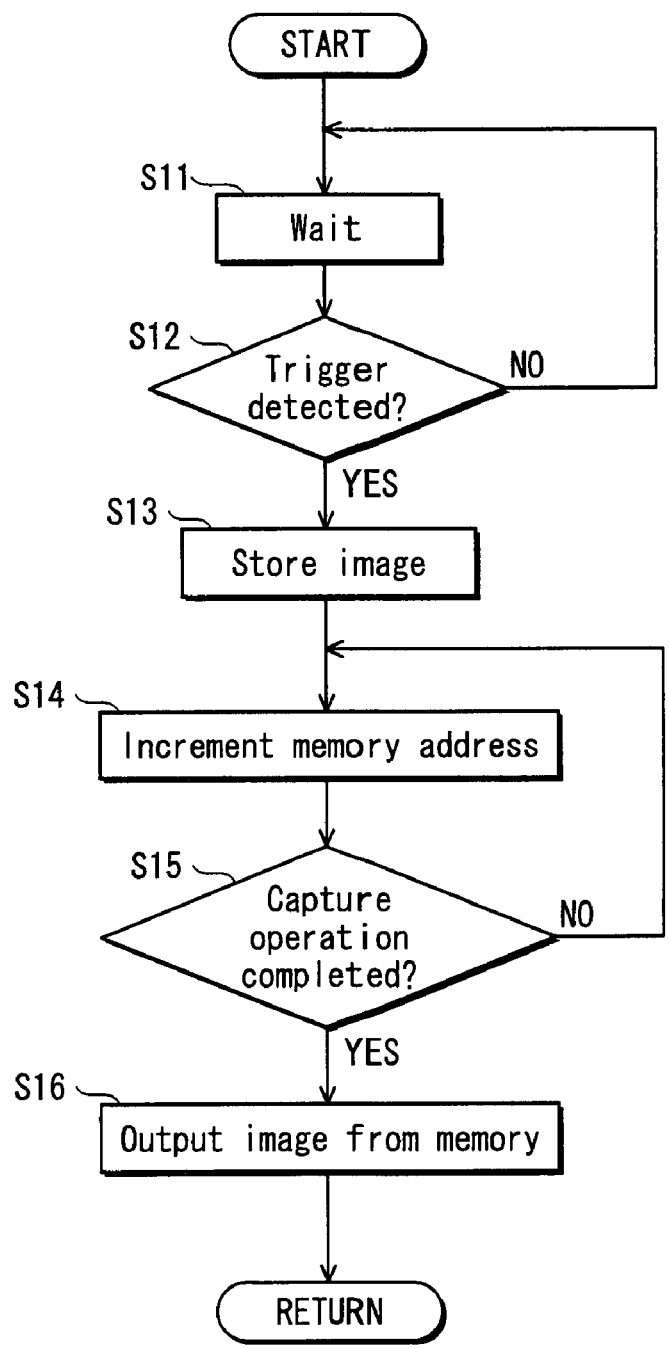
FIG. 13 is a flowchart showing how imaging using the digital camera is performed.

FIG. 13 is a flowchart showing how imaging using the digital camera is performed.

In await state (step S11), if a trigger signal instructing to start imaging is detected (YES in step S12), a signal charge as image information starts to be stored into a storage device in a pixel (step S13).

Each time the storage (capture) is performed, the memory address is incremented (step S14). When imaging is performed as many times as the number of storage devices, the capture operation is completed (step S15).

After the capture operation is completed, the imaging operation is stopped, and the control moves to the output mode in which the imaged data is output sequentially (an image is output) (step S16).

After all data is completely output, the control returns to the wait state in step S11.

This flowchart shows that it is possible to perform imaging at a high speed as many times as the number of storage devices (until all the storage devices are filled with data). Then, after the data is completely read out from the storage devices, the high-speed imaging becomes possible again. That is to say, the high-speed imaging can be performed continuously, though intermittently.

More specifically, imaging at a high-speed rate of more than 1000 frames per second is performed as many times as the number of storage devices, and the data is transferred to outside. The imaging can be repeated intermittently by repeating this process.

It should be noted here that writing to free memories is possible even while the data is being transferred to outside.

(4) Storage Device

In the above-described embodiments, a gate capacitance type capacitor is used as a storage device. However, not limited to this, other types of capacitors may be used.

(4-1) Capacitor Formed between Wiring Layer Metals

Figure 14:
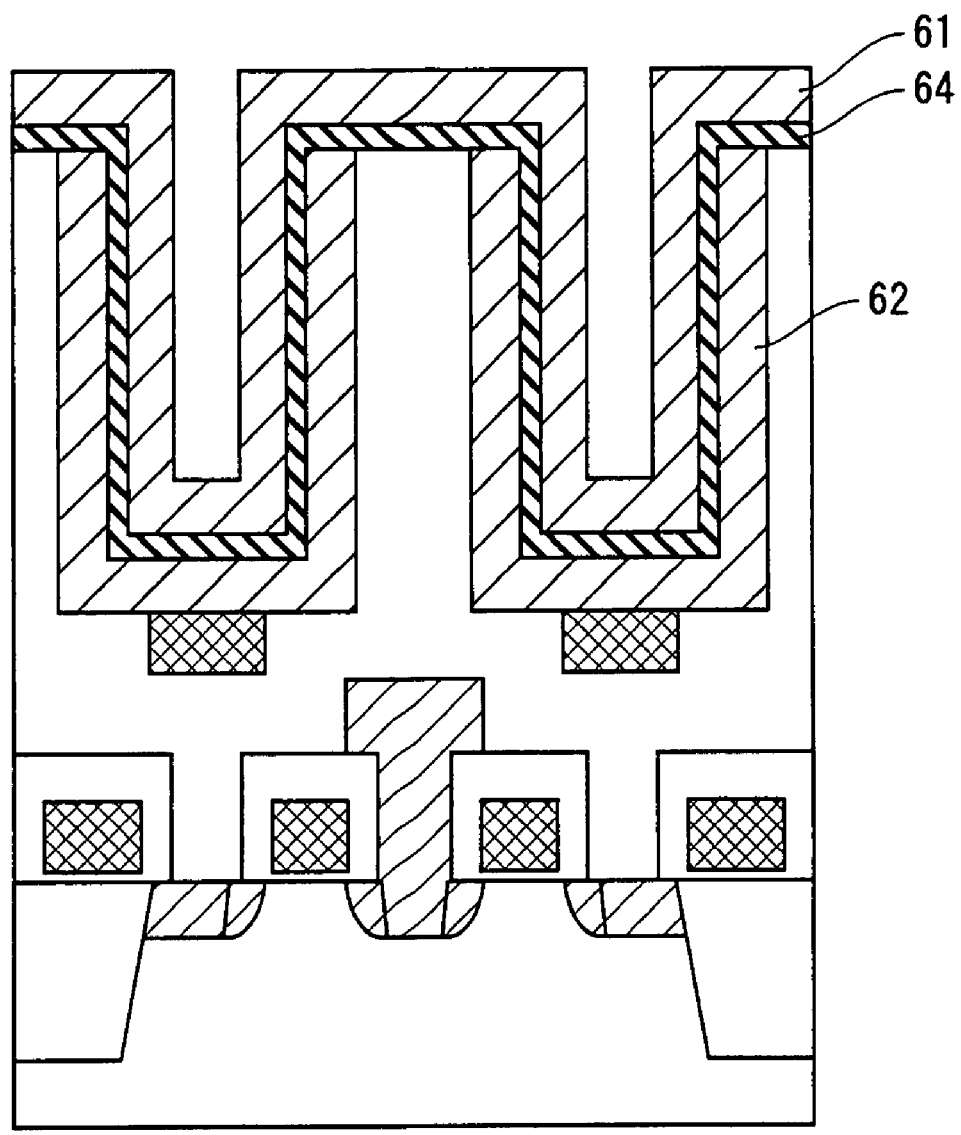
FIG. 14 shows a capacitor formed between wiring layer metals.

FIG. 14 shows a capacitor formed between wiring layer metals.

As shown in FIG. 14, an MIM (Metal Insulator Metal) type capacitor 60 includes an upper electrode 61, a lower electrode 62, and a capacitance insulation film 64 sandwiched by the two electrodes.

Such an MIM type capacitor has characteristics: (a) high accuracy, high capacity possible; (b) three dimensional shape, easy to integrate; and (c) relatively easy to laminate in layers since a diffusion layer is not used.

(4-2) Trench Type Capacitor

Figure 15:
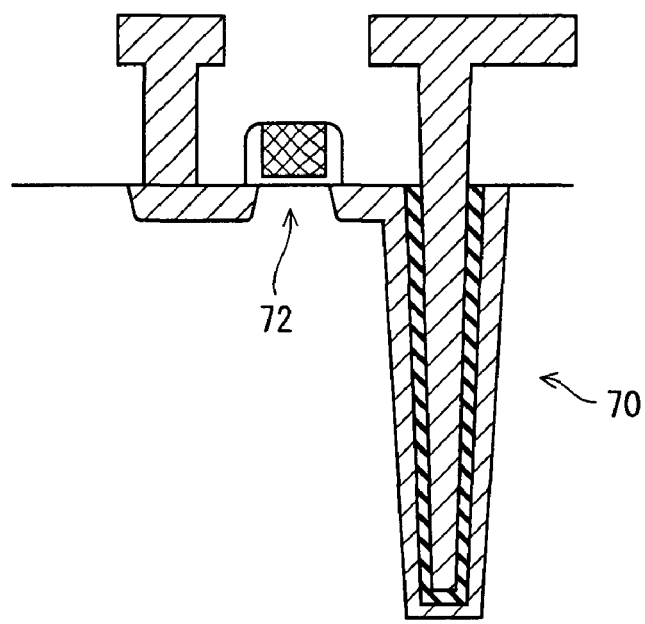
FIG. 15 shows a trench type capacitor 70.

FIG. 15 shows a trench type capacitor 70.

The trench type capacitor 70 shown in FIG. 15 has a structure that is adopted in DRAM or the like. The structure provides high integration.

A selection transistor 72 is a transistor that selects a capacitor to read.

(4-3) Bonding Chips

Figure 16:
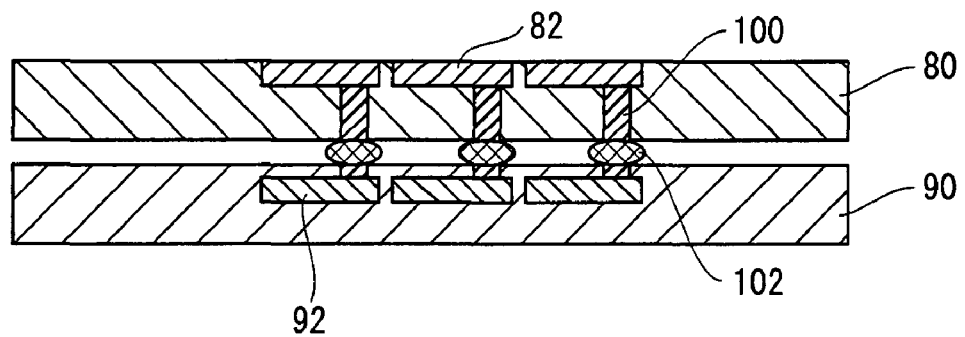
FIG. 16 shows an example in which capacitors are formed by bonding chips together.

Another structure is shown in FIG. 16. This structure is formed by preparing: an imaging device substrate 80 in which solid-state imaging devices have been formed; and a memory substrate 90 in which capacitor arrays (memory arrays) 92 have been formed, and connecting the two substrates 80 and 90 to each other.

As one example, the structure is formed as follows. First, vias passing through the imaging device substrate 80 are formed respectively in correspondence with pixels 82 of the solid-state imaging devices. Then, terminals are formed on a back surface of the imaging device substrate 80. Capacitor arrays 92 are formed in the memory substrate 90 with the same pitch as the pixels 82. Then, terminals of the capacitor arrays 92 are formed with the same pitch as the terminals having been formed on the back surface of the imaging device substrate 80. The two substrates having been formed in this way are connected to each other by gold bumps 102, or by bonding the terminal metals of the substrates with each other.

This method makes it possible to form the solid-state imaging devices and the capacitor arrays, with most suitable processes respectively, and thus makes it possible to realize a high-speed camera having a high-capacity storage devices with use of highly-integrated capacitors.

(4-4) Nonvolatile Memory

Nonvolatile memories may be used as recording devices. For example, it is possible to store information in a nonvolatile manner by using devices, such as ferroelectric capacitors, that can store, in a nonvolatile manner, the amount of polarization that is obtained by applying a voltage between electrodes. This makes it possible to keep the information stored even if a power-off occurs. Such a structure may be used for the security purpose or for recording an accident. For example, a solid-state imaging device (camera) having a nonvolatile memory may be attached to an automobile, where, when a sensor in the camera detects a shock of an accident, the camera starts imaging and recording an image immediately after the accident. Here, if an amount of power enough to drive the camera for several seconds is supplied, the imaging can be completed and the information can be stored in the nonvolatile memory. This makes it possible to see the information later. Alternatively, the imaging may be performed continuously by overwriting the information in the memory, and the imaging is stopped when the sensor detects a shock of an accident. This structure makes it possible to record images of before and after an accident.

(5) NC Circuit

An example of the circuit structure of the NC unit 22, which is shown in FIG. 1 or the like, will be described.

Figure 17A:
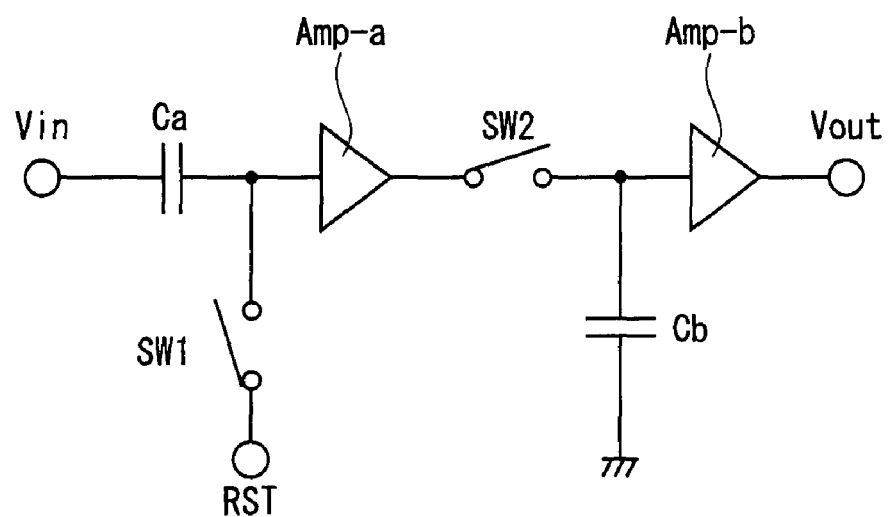
FIG. 17A shows a circuit structure of the NC unit (CDS circuit) 22.
Figure 17B:
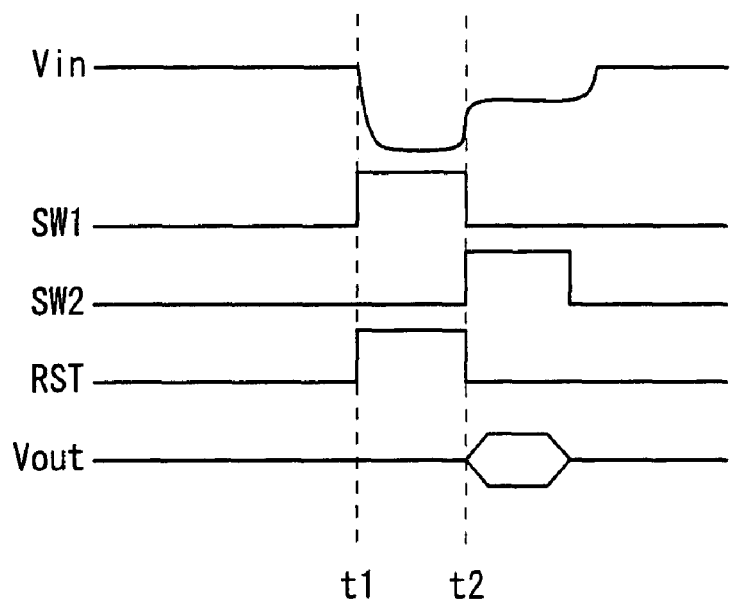
FIG. 17B is a timing chart corresponding to the circuit shown in FIG. 17A.

FIG. 17A shows a circuit structure of the NC unit (CDS circuit) 22. FIG. 17B is a timing chart corresponding to the circuit shown in FIG. 17A.

As shown in the timing chart of FIG. 17B, at timing t1, switch SW1 is turned on, switch SW2 is turned off, and a signal from a pixel is input to Vin.

Then, at timing t2, switch SW1 is turned off, switch SW2 is turned on, and a pixel signal of a reset is input to Vin. This makes it possible to read, from Vout, a difference between a pixel signal after an exposure and the pixel signal of a reset.

Not limited to the structure shown in FIG. 17A, the NC unit 22 may be structured variously.

(6) Imaging Device

In the above-described embodiments, the imaging devices are of a type in which MOS transistors are used to select images. However, not limited to this, the imaging devices may be if the CCD type.

(7) Circuit Structure

In the above description, circuit diagrams are used to explain the structure of the pixel. However, the number of storage devices, the arrangement of storage devices and the like are not limited to those shown in the diagrams.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A solid-state imaging device comprising a plurality of pixels each of which includes:

a photoelectric conversion device operable to perform a photoelectric conversion and output signal charges;

a plurality of signal charge holding units operable to hold the signal charges output from the photoelectric conversion device;

a write target switching unit operable to select, from among the signal charge holding units, one to which to write a signal charge that is output at a first time point, and switch from the selected one to another one among the signal charge holding units to which to write a signal charge that is output at a second time point after the first time point; and a read target switching unit operable to select, from among the signal charge holding units, one from which to read a signal charge.

2. The solid-state imaging device of claim 1, wherein an order in which the read target switching unit selects the signal charge holding units is equal to an order in which signal charges are written thereto.

3. The solid-state imaging device of claim 1, wherein the write target switching unit continues to switch between the signal charge holding units at a regular time interval after the second time point until all the signal charge holding units have been selected.

4. The solid-state imaging device of claim 1 further comprising an imaging operation unit operable to cause all pixels to start performing an imaging operation simultaneously.

5. The solid-state imaging device of claim 1, wherein each pixel further includes:

a pre-writing amplifier device operable to amplify a signal output from the photoelectric conversion device before the signal is written to one of the signal charge holding units;

a post-reading amplifier device operable to amplify the signal read from the signal charge holding unit; and an output device operable to output the signal, which was amplified by the post-reading amplifier device, to outside the pixel.

6. The solid-state imaging device of claim 1, wherein each pixel further includes an amplifier circuit that is shared by the pre-writing amplifier device and the post-reading amplifier device, and use of the amplifier circuit is switched between the pre-writing amplifier device and the post-reading amplifier device, for writing and reading, respectively.

7. The solid-state imaging device of claim 1, wherein the signal charge holding units are nonvolatile storage devices.

8. The solid-state imaging device of claim 1, wherein the signal charge holding units are gate capacitance type capacitors.

9. The solid-state imaging device of claim 1, wherein each of the signal charge holding units is a capacitor formed between wiring layer metals.

10. The solid-state imaging device of claim 1, wherein the signal charge holding units are capacitors having metal electrodes, such as trench type capacitors.

11. The solid-state imaging device of claim 1, wherein the signal charge holding units are capacitor arrays formed on a sub substrate that is different from a main substrate, and the main substrate and the sub substrate are connected to each other by an external contact terminal.

12. The solid-state imaging device of claim 1 further comprising:
a storage device that is located outside the plurality of pixels, and stores therein a dark signal output from the photoelectric conversion device, when a signal is read from one of the signal charge holding units to outside a pixel; and
a noise removing circuit operable to remove a variation in the pixels by calculating a difference between the dark signal stored in the storage device and a signal charge held by the one of the signal charge holding units.

13. A digital camera comprising the solid-state imaging device defined in claim 1.

* * * * *